United States Patent
Huang et al.

(10) Patent No.: US 9,721,792 B2
(45) Date of Patent: Aug. 1, 2017

(54) METHOD OF FORMING STRAIN-RELAXED BUFFER LAYERS

(71) Applicant: Applied Materials, Inc., Santa Clara, CA (US)

(72) Inventors: Yi-Chiau Huang, Fremont, CA (US); Yihwan Kim, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 125 days.

(21) Appl. No.: 14/465,330

(22) Filed: Aug. 21, 2014

(65) Prior Publication Data
US 2015/0079803 A1    Mar. 19, 2015

Related U.S. Application Data

(60) Provisional application No. 61/878,376, filed on Sep. 16, 2013.

(51) Int. Cl.
*H01L 21/02* (2006.01)
*H01L 21/67* (2006.01)

(52) U.S. Cl.
CPC .... *H01L 21/02587* (2013.01); *H01L 21/0237* (2013.01); *H01L 21/0245* (2013.01); *H01L 21/0254* (2013.01); *H01L 21/0262* (2013.01); *H01L 21/02373* (2013.01); *H01L 21/02378* (2013.01); *H01L 21/02389* (2013.01); *H01L 21/02439* (2013.01); *H01L 21/02502* (2013.01);
(Continued)

(58) Field of Classification Search
CPC . H01L 21/02104; H01L 21/31; H01L 21/469; H01L 21/4763; H01L 31/0216; H01L 23/44; H01L 41/314; H01L 41/331; H01L 41/35; H01L 45/16; H01L 51/0002; H01L 51/0021
See application file for complete search history.

(56) References Cited

U.S. PATENT DOCUMENTS

| 5,659,188 A | 8/1997 | Kao et al. |
| 5,891,769 A | 4/1999 | Liaw et al. |

(Continued)

FOREIGN PATENT DOCUMENTS

| EP | 1928020 A1 | 6/2008 |
| EP | 2251897 A1 | 11/2010 |

OTHER PUBLICATIONS

Sakai, et al, Reduction of Threading Dislocation Density in SiGe Layers on Si (001) Using a Two-step Strain-relaxation Procedure, Applied Physics Letters, vol. 79, No. 21, Nov. 19, 2001.
(Continued)

*Primary Examiner* — Duy T Nguyen
*Assistant Examiner* — Bo Bin Jang
(74) *Attorney, Agent, or Firm* — Patterson + Sheridan, LLP

(57) ABSTRACT

Implementations described herein generally relate to methods for relaxing strain in thin semiconductor films grown on another semiconductor substrate that has a different lattice constant. Strain relaxation typically involves forming a strain relaxed buffer layer on the semiconductor substrate for further growth of another semiconductor material on top. Whereas conventionally formed buffer layers are often thick, rough and/or defective, the strain relaxed buffer layers formed using the implementations described herein demonstrate improved surface morphology with minimal defects.

12 Claims, 7 Drawing Sheets

(52) U.S. Cl.
CPC .. *H01L 21/02521* (2013.01); *H01L 21/02524* (2013.01); *H01L 21/02529* (2013.01); *H01L 21/02532* (2013.01); *H01L 21/02538* (2013.01); *H01L 21/02554* (2013.01); *H01L 21/02617* (2013.01); *H01L 21/02664* (2013.01); *H01L 21/67115* (2013.01)

(56) References Cited

U.S. PATENT DOCUMENTS

| | | | |
|---|---|---|---|
| 6,515,335 B1* | 2/2003 | Christiansen | H01L 21/02381 |
| | | | 257/189 |
| 6,593,625 B2 | 7/2003 | Christiansen et al. | |
| 7,166,528 B2 | 1/2007 | Kim et al. | |
| 7,459,374 B2 | 12/2008 | Aulnette et al. | |
| 8,093,143 B2 | 1/2012 | Storck et al. | |
| 8,093,154 B2 | 1/2012 | Zojaji et al. | |
| 2009/0016853 A1* | 1/2009 | Yoo | H01L 21/67201 |
| | | | 414/147 |
| 2010/0006024 A1 | 1/2010 | Brabant et al. | |
| 2011/0140246 A1* | 6/2011 | Hoenk | C23C 14/022 |
| | | | 257/655 |
| 2011/0156098 A1 | 6/2011 | Majhi et al. | |
| 2012/0077335 A1 | 3/2012 | Sanchez et al. | |

OTHER PUBLICATIONS

International Search Report and Written Opinion for International Application No. PCT/US2014/052167 dated Nov. 28, 2014.

\* cited by examiner

METHOD OF FORMING STRAIN-RELAXED BUFFER LAYERS

CROSS-REFERENCE TO RELATED APPLICATIONS

This application claims benefit of U.S. provisional patent application Ser. No. 61/878,376, filed Sep. 16, 2013. The aforementioned related patent application is herein incorporated by reference in its entirety.

BACKGROUND

Field

Implementations of the present disclosure generally relate to methods and apparatus for forming a film on a substrate. More particularly, implementations of the present disclosure relate to methods and apparatus for heteroepitaxial growth of crystalline films.

Description of the Related Art

Group III-V and Group II-IV compounds are finding greater importance in the development and fabrication of a variety of semiconductor devices, such as, for example, complementary metal-oxide semiconductors (CMOS), light emitting diodes (LEDs), laser diodes (LDs) and logic circuit devices such as field effect transistors (FETs). In these devices, a plurality of semiconductor layers having different mixed crystal compositions are layered together to obtain intended optical and electrical characteristics.

Group III-V and Group IV compound films are generally formed by heteroepitaxy, a form of epitaxy. In epitaxy, a monocrystalline film is deposited on a monocrystalline substrate from gaseous or liquid precursors. During deposition, the substrate acts as a seed crystal, the deposited film takes on a lattice structure and orientation identical to those of the substrate. The deposited film is typically referred to as an epitaxial film or epitaxial layer. In heteroepitaxy, the epitaxial film and the substrate typically include different materials having different properties, for example, lattice constant and thermal expansion coefficient. The differences in properties introduce defects in the epitaxial film and may even cause the substrates to crack when growing high crystalline nitrides. For example, when growing gallium nitride material on a silicon substrate, mechanical stress and thermal stress are generated due to difference in lattice constants and thermal expansion coefficients causing the silicon substrate to bow and the gallium nitride film and even the silicon substrate to crack.

One approach to reducing the defect density involves growing thick strain relaxed buffer (SRB) layers on the substrate. These thick SRB layers that may be targeted for strain relaxation can be expensive to grow. Others have attempted to grow dissimilar materials that have a tendency to relax quickly on the substrate of choice, or otherwise grow thicker films that eventually relax due to accumulated strain. However, these processes often take a long time to complete and involve costly materials. Thus, there is a need for thinner strain relaxed buffer layers that reduce defect density while reducing processing times and costs. However, these thinner buffer layers often suffer from morphological defects after being exposed to subsequent annealing processes.

Therefore, there is a need for methods for depositing thin strain relaxed buffer layers that maintain smooth surface morphology after exposure to subsequent annealing processes.

SUMMARY

Implementations of the present disclosure generally relate to methods and apparatus for forming a film on a substrate. More particularly, implementations of the present disclosure relate to methods and apparatus for heteroepitaxial growth of crystalline films. In one implementation, a method of heteroepitaxial deposition of a strain relaxed buffer (SRB) layer on a substrate is provided. The method comprises epitaxially depositing a buffer layer on a dissimilar substrate, epitaxially depositing a silicon containing capping layer on the buffer layer, determining whether the buffer layer has achieved a desired thickness and annealing the buffer layer and silicon capping layer to relax the buffer layer.

In another implementation, a method of heteroepitaxial deposition of a strain relaxed buffer (SRB) layer on a substrate is provided. The method comprises epitaxially depositing a silicon germanium ($Si_{1-x}Ge_x$) buffer layer on a silicon substrate, wherein $0<x<1$ epitaxially depositing a silicon capping layer on the silicon germanium buffer layer, determining whether the silicon germanium buffer layer has achieved a desired thickness and annealing the silicon germanium buffer layer and silicon capping layer to relax the silicon germanium buffer layer.

In yet another implementation, a method of forming a heteroepitaxial film on a substrate in an integrated processing system is provided. The method comprises epitaxially depositing a buffer layer over a substrate in a first processing chamber of an integrated processing system, epitaxially depositing a silicon containing capping layer over the buffer layer, transferring the substrate to a second processing chamber of the integrated processing system and annealing the buffer layer in the second processing chamber. The silicon containing capping layer may be deposited over the buffer layer in the first processing chamber. The silicon containing capping layer may be deposited over the buffer layer in a third processing chamber of the integrated processing system.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations described herein generally relate to methods for relaxing strain in thin semiconductor films grown on another semiconductor substrate that has a different lattice constant. Strain relaxation typically involves forming a strain relaxed buffer layer on the semiconductor substrate for further growth of another semiconductor material on top. Whereas conventionally formed buffer layers are often thick, rough and/or defective, the strain relaxed buffer layers formed using the implementations described herein demonstrate improved surface morphology with minimal defects.

A high-quality semiconductor film with relaxed strains can be of great technical importance in state of the art microchip fabrication. Relaxation of a SiGe layer is usually achieved by thermal anneal of the SiGe layer. However, this relaxation often leads to the generation of dislocations and stacking faults in the film. Theses defects often propagate in the germanium film grown on top and not only degrade the germanium film but also roughen the film surface. The implementations described herein not only relax strain in these semiconductor films and control surface morphology but also minimize the generation of threading dislocations through the use of (silicon/silicon germanium) or (Si/SiGe) superlattice. Epitaxial germanium grown on top of strain relaxed buffers, according to implementations described herein, demonstrates high compressive stress and improved morphology.

Figure 1:
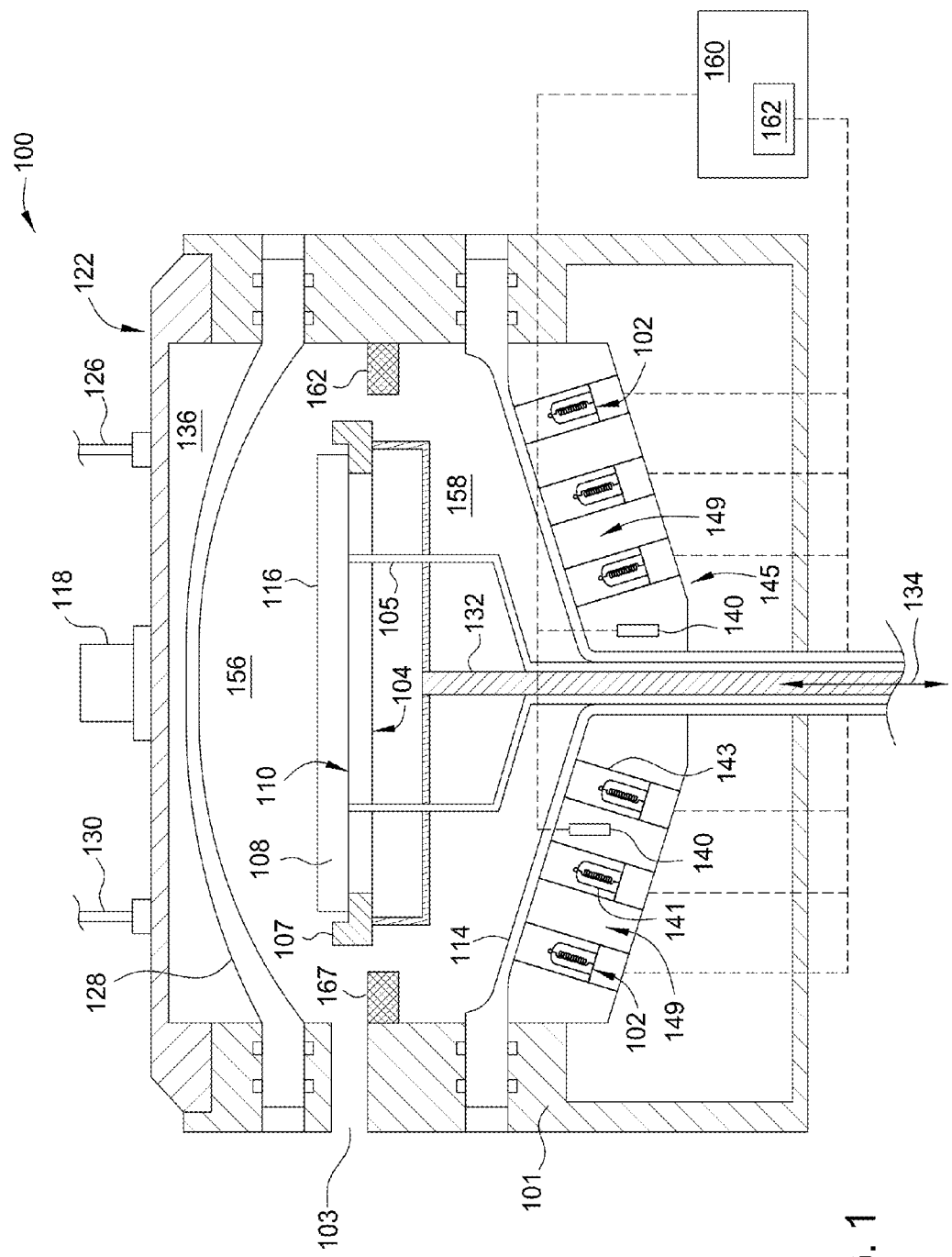
FIG. 1 is a schematic cross-sectional view of a processing chamber for performing the implementations described herein.

FIG. 1 is a schematic cross-sectional view of a processing chamber for performing the implementations described herein. The processing chamber 100 may be used to process one or more substrates, including the deposition of a material on an upper surface of a substrate 108. The processing chamber 100 generally includes an array of radiant heating lamps 102 for heating, among other components, a backside 104 of a substrate support 107 disposed within the processing chamber 100. The substrate support 107 may be a ring-like substrate support as shown, which supports the substrate from the edge of the substrate, a disk-like or platter-like substrate support, or a plurality of pins, for example three pins. The substrate support 107 is located within the processing chamber 100 between an upper dome 128 and a lower dome 114. The substrate 108 (not to scale) can be brought into the processing chamber 100 and positioned onto the substrate support 107 through a loading port 103.

The substrate support 107 is shown in an elevated processing position, but may be vertically traversed by an actuator (not shown) to a loading position below the processing position to allow lift pins 105 to contact the lower dome 114, passing through holes in the substrate support 107, and raise the substrate 108 from the substrate support 107. A robot (not shown) may then enter the processing chamber 100 to engage and remove the substrate 108 therefrom though the loading port 103. The substrate support 107 then may be actuated up to the processing position to place the substrate 108, with its device side 116 facing p, on a front side 110 of the substrate support 107.

The substrate support 107, while supporting the substrate 108 in the processing position, divides the internal volume of the processing chamber 100 into a processing gas region 156 (above the substrate) and a purge gas region 158 (below the substrate support 107). The substrate support 107 is rotated during processing by a central shaft 132 to minimize the effect of thermal and processing gas flow spatial anomalies within the processing chamber 100 and thus facilitate uniform processing of the substrate 108. The substrate support 107 is supported by the central shaft 132, which moves the substrate 108 in an up and down direction 134 during loading and unloading, and in some instances, processing of the substrate 108. The substrate support 107 is typically formed from a material having low thermal mass or low heat capacity, so that energy absorbed and emitted by the substrate support 107 is minimized. The substrate support 107 may be formed from silicon carbide or graphite coated with silicon carbide to absorb radiant energy from the lamps 102 and conduct the radiant energy to the substrate 108. The substrate support 107 is shown in FIG. 1 as a ring with a central opening to facilitate exposure of the substrate to the thermal radiation from the lamps 102. The substrate support 107 may also be a platter-like member with no central opening.

In general, the upper dome 128 and the lower dome 114 are typically formed from an optically transparent material such as quartz. The upper dome 128 and the lower dome 114 are thin to minimize thermal memory, typically having a thickness between about 3 mm and about 10 mm, for example about 4 mm. The upper dome 128 may be thermally controlled by introducing a thermal control fluid, such as a cooling gas, through an inlet portal 126 into a thermal control space 136, and withdrawing the thermal control fluid through an exit portal 130. In some implementations, a cooling fluid circulating through the thermal control space 136 may reduce deposition on an inner surface of the upper dome 128.

One or more lamps, such as an array of lamps 102, can be disposed adjacent to and beneath the lower dome 114 in a specified, optimal desired manner around the central shaft 132 to heat the substrate 108 as the processing gas passes over, thereby facilitating the deposition of a material onto the upper surface of the substrate 108. In various examples, the material deposited onto the substrate 108 may be a group III, group IV, and/or group V material, or may be a material including a group III, group IV, and/or group V dopant.

The lamps 102 may be adapted to heat the substrate 108 to a temperature within a range of about 200 degrees Celsius to about 1200 degrees Celsius (e.g., from about 300 degrees Celsius to about 950 degrees Celsius). The lamps 102 may include bulbs 141 surrounded by an optional reflector 143. Each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively cools the lower dome 114 due in part to the close proximity of the lamphead 145 to the lower dome 114. The lamphead 145 may also cool the lamp walls and walls of the reflector 143. If desired, the lamphead 145 may or may not be in contact with the lower dome 114.

A circular shield 167 may be optionally disposed around the substrate support 107 and coupled to sidewall of the chamber body 101. The shield 167 prevents or minimizes leakage of heat/light noise from the lamps 102 to the device side 116 of the substrate 108 in addition to providing a pre-heat zone for the processing gases. The shield 167 may be made from CVD SiC coated sintered graphite, grown SiC, or a similar opaque material that is resistant to chemical breakdown by processing and cleaning gases.

A reflector 122 may be optionally placed outside the upper dome 128 to reflect infrared light that is radiating off the substrate 108 back onto the substrate 108. Due to the reflected infrared light, the efficiency of the heating will be improved by containing heat that could otherwise escape the processing chamber 100. The reflector 122 can be made of a metal such as aluminum or stainless steel. The reflector 122 can have machined channels (not shown) to carry a flow of a fluid such as water for cooling the reflector 122. If desired, the efficiency of the reflection can be improved by coating a reflector area with a highly reflective coating such as with gold.

A plurality of thermal radiation sensors 140, which may be pyrometers, are disposed in the lamphead 145 for measuring thermal emissions of the substrate 108. The sensors 140 are typically disposed at different locations in the lamphead 145 to facilitate viewing different locations of the substrate 108 during processing. Sensing thermal radiation from different locations of the substrate 108 facilitates comparing the thermal energy content, for example the temperature, at different locations of the substrate 108 to determine whether temperature anomalies or non-uniformities are present. Such non-uniformities can result in non-uniformities in film formation, such as thickness and composition. At least two sensors 140 are used, but more than two may be used. Different implementations may use three, four, five, six, seven, or more sensors 140.

Each sensor 140 views a zone of the substrate 108 and senses the thermal state of a zone of the substrate. The zones may be oriented radially in some implementations. For example, in implementations where the substrate 108 is rotated, the sensors 140 may view, or define, a central zone in a central portion of the substrate 108 having a center substantially the same as the center of the substrate 108, with one or more zones surrounding the central zone and concentric therewith. It is not required that the zones be concentric and radially oriented, however. In some implementations, zones may be arranged at different locations of the substrate 108 in non-radial fashion.

The sensors 140 are typically disposed between the lamps 102, for example in the channels 149, and are usually oriented substantially normal to the substrate 108. In some implementations the sensors 140 are oriented normal to the substrate 108, while in other implementations, the sensors 140 may be oriented in slight departure from normality. An orientation angled within about 5° of normal is most frequently used.

The sensors 140 may be attuned to the same wavelength or spectrum, or to different wavelengths or spectra. For example, substrates used in the processing chamber 100 may be compositionally homogeneous, or they may have domains of different compositions. Using sensors 140 attuned to different wavelengths may allow monitoring of substrate domains having different composition and different emission responses to thermal energy. Typically, the sensors 140 are attuned to infrared wavelengths, for example about 4 µm.

A top thermal sensor 118 may be disposed in the reflector 122 to monitor a thermal state of the upper dome 128, if desired, or to monitor the thermal state of the substrate 108 from a viewpoint opposite that of the sensors 140. Such monitoring may be useful to compare to data received from the sensors 140, for example to determine whether a fault exists in the data received from the sensors 140. The top thermal sensor 118 may be an assembly of sensors in some cases, featuring more than one individual sensor. Thus, the processing chamber 100 may feature one or more sensors disposed to receive radiation emitted from a first side of a substrate and one or more sensors disposed to receive radiation from a second side of the substrate opposite the first side.

A controller 160 receives data from the sensors 140 and separately adjusts power delivered to each lamp 102, or individual groups of lamps or lamp zones, based on the data. The controller 160 may include a power supply 162 that independently powers the various lamps or lamp zones. The controller 160 can be configured with a desired temperature profile, and based on comparing the data received from the sensors 140; the controller 160 adjusts power to lamps and/or lamp zones to conform the observed thermal data to the desired temperature profile. The controller 160 may also adjust power to the lamps and/or lamp zones to conform the thermal treatment of one substrate to the thermal treatment of another substrate, in the event chamber performance drifts over time.

Figure 2:
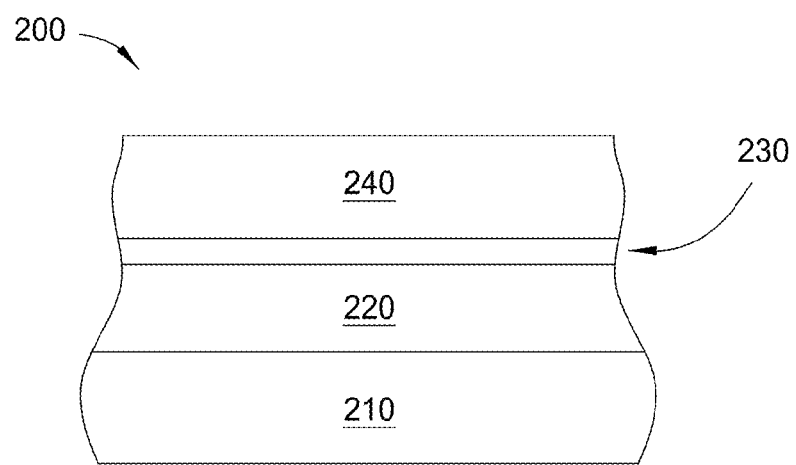
FIG. 2 is a schematic structure of a device formed according to one implementation described herein.
Figure 3:
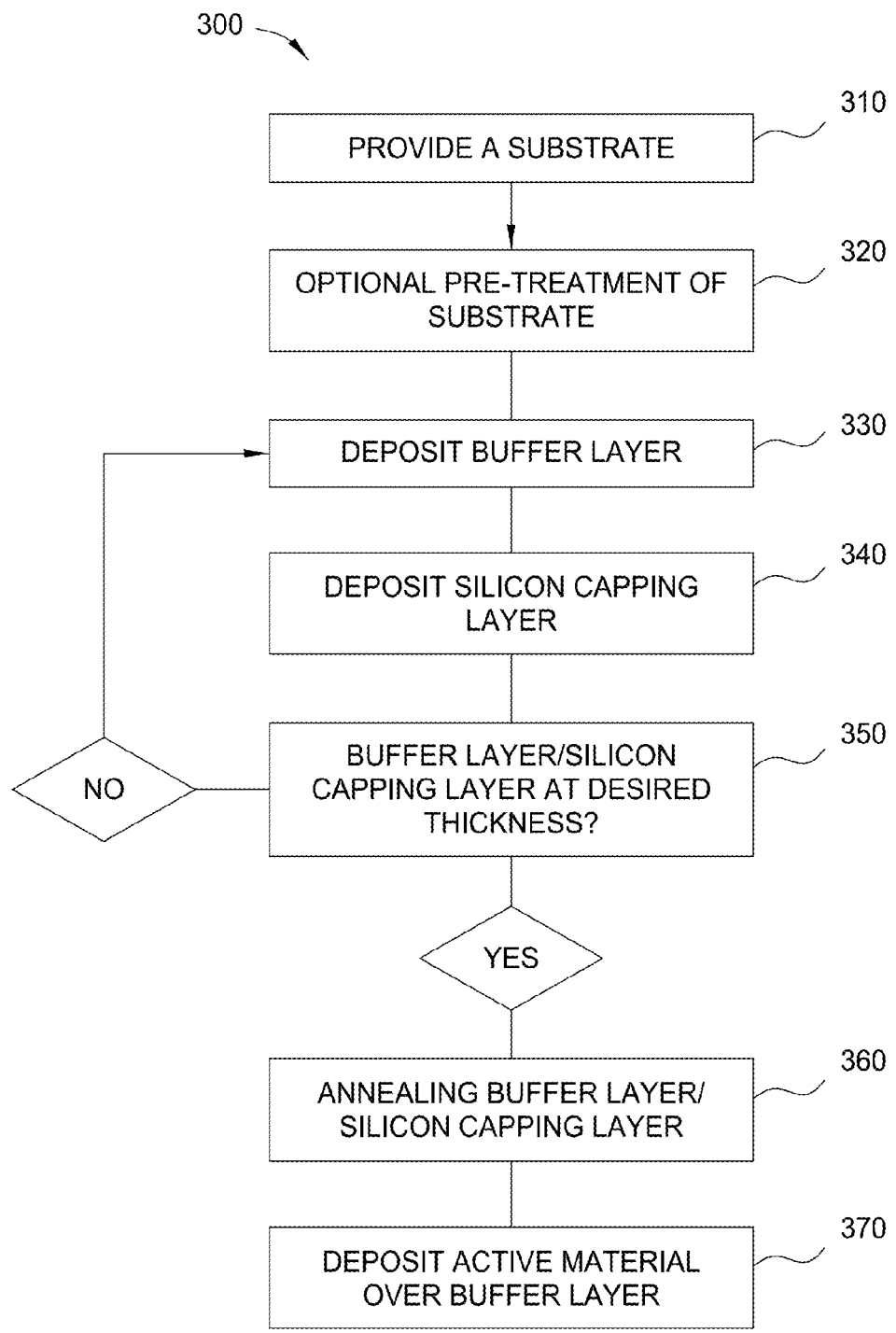
FIG. 3 is a flow diagram depicting a method for forming a structure using heteroepitaxial deposition according to one implementation described herein.

FIG. 2 is a schematic structure of a device 200 formed according to one implementation described herein. FIG. 3 is a flow diagram depicting a method 300 for forming a structure, for example, device 200 of FIG. 2, using heteroepitaxial deposition according to implementations described herein. Method 300 begins by providing a substrate 210 to a reaction chamber at block 310. The substrate may be substrate 210 as depicted in FIG. 2. The substrate may be any substrate that an epitaxial layer can be formed on. These substrates may include, for example, substrate wafers made from sapphire ($Al_2O_3$), silicon (Si) (doped and undoped), crystalline silicon (e.g., Si<100> or Si<111>), silicon oxide, strained silicon, silicon germanium, doped or undoped polysilicon, silicon carbide (SiC), spinel, zinc oxide, as well as compound semiconductor substrates such as gallium-arsenide (GaAs), lithium gallate, indium phosphide (InP), single-crystal GaN, aluminum nitride (AlN), $GdScO_3$ (GSO), $MoSe_2$, $Ge_2Sb_2Te_5$ (GST) other chalcogenide materials, patterned or non-patterned substrates, among other substrates.

At block 320, the substrate may be exposed to a pre-treatment process. The pre-treatment process may involve exposing the substrate to at least one of cleaning, polishing, etching, reducing, oxidizing, hydroxylating, annealing, and/or baking the substrate surface. In implementations where the pre-treatment process is a pre-clean process, the pre-clean process may be used to remove native oxides from the surface of the substrate. In some implementations where processing of the substrate is performed ex-situ to the processing cluster tool, the substrate may be subjected to a pre-clean and/or degas process upon entering the cluster tool. For example, if the substrate is a silicon substrate, the Applied Materials SICONI™ Preclean process may be performed on the substrate for removing oxide from the silicon substrate. The SICONI™ Pre-clean process removes native oxide through a low-temperature, two-part dry chemical clean process using $NF_3$ and $NH_3$. The pre-clean process may be performed in a processing chamber positioned on a cluster tool, for example, cluster tool 700 (see FIG. 7). Exemplary pre-clean chambers in which the pre-clean process of block 320 may be performed include the SICONI™ pre-clean chamber available from Applied Materials, Inc. of Santa Clara, Calif.

In some implementations, the substrate may be exposed to a fluorine containing precursor and a hydrogen containing precursor in a two part dry chemical clean process. In some implementations, the fluorine containing precursor may comprise nitrogen trifluoride ($NF_3$), hydrogen fluoride (HF), diatomic fluorine ($F_2$), monatomic fluorine (F) and fluorine-substituted hydrocarbons, combinations thereof, or the like. In some implementations, the hydrogen containing precursors may comprise atomic hydrogen (H), diatomic hydrogen ($H_2$), ammonia ($NH_3$), hydrocarbons, incompletely halogen-substituted hydrocarbons, combinations thereof, or the like.

In some implementations, the first part in the two part process may comprise using a remote plasma source to generate an etchant species (e.g., ammonium fluoride ($NH_4F$)) from the fluorine containing precursor (e.g., nitrogen trifluoride ($NF_3$)) and the hydrogen containing precursor (e.g., ammonia ($NH_3$)). By using a remote plasma source, damage to the substrate may be minimized. The etchant species are then introduced into the pre-clean chamber and condensed into a solid by-product on the substrate surface through a reaction with native oxide layer. The second part may then comprise an in-situ anneal to decompose the by-product using convection and radiation heating. The by-product then sublimates and may be removed from the substrate surface via a flow of gas and pumped out of the pre-clean chamber.

In some implementations where the pre-treatment process is a high temperature bake process, the substrate may be exposed to a high temperature in a hydrogen containing environment to remove native oxides from the surface of the substrate.

At block 330 a buffer layer is deposited on the surface of the substrate. The buffer layer may be buffer layer 220 as depicted in FIG. 2. The buffer layer 220 may comprise any material that helps accommodate the lattice mismatch between the substrate 210 and the active material layer 240. The buffer layer 220 may be any crystalline film which has a similar lattice structure to the crystalline film that is to be formed thereon. The buffer layer may comprise a Group III-V material or a Group IV material. The buffer layer may be a binary film, ternary film, or quaternary film. Exemplary buffer layer include but are not limited to GaN, AlN, AlGaN, InGaN, InAlGaN, GaAs, $In_xAl_{1-x}As$, $In_xGa_{1-x}As$, InAs, Ge, $Si_{1-x}Ge_x$, SiC, Si:C, Si:CP, SiGe:C, SiGe:B, GeSn, GaSb, GaP, InP, AlSb, AlP, AlSbP, $MoSe_2$, $Ge_{(1-x)}Sn_x$, $Si_{(1-x-y)}Ge_xSn_y$, and combinations thereof, and may be undoped or doped with an n-type or p-type dopant element depending upon application, or modified for additional properties, e.g. insulation, wherein 0<x,y<1 and 0<x+y<1. In some implementations, the buffer layer is a material selected from the group consisting of: AlN, AlGaN, InGaN, InAlGaN, GaAs, InAlAs, Si, Ge, C, Sn, SiGe, SiC, GaSb, AlSb, GaP, AlP, InP, InSb, ZnO, $WSe_2$, $MoSe_2$, $Ge_{(1-x)}Sn_x$, $Si_{(1-x-y)}Ge_xSn_y$, and combinations thereof wherein 0<x,y<1 and 0<x+y<1.

The buffer layer 220 may be deposited using any suitable deposition technique. Suitable deposition techniques include epitaxial deposition processes, metal organic chemical vapor deposition (MOCVD) processes, hydride vapor phase epitaxial (HVPE) processes, physical vapor deposition (PVD) processes, chemical vapor deposition (CVD) processes, atomic layer deposition (ALD) processes, Atomic Layer Epitaxy (ALE) and/or any other suitable process.

As-deposited the buffer layer 220 may have one or more layers with a thickness from about 50 Å to about 5,000 Å, depending on the material system and the application. As-deposited the buffer layer 220 may have a thickness from about 100 Å to about 3,000 Å. As-deposited the buffer layer 220 may have a thickness from about 500 Å to about 1,000 Å.

In some implementations where the buffer layer is a silicon germanium (SiGe) layer the silicon germanium layer may be epitaxially grown. During this deposition process, a silicon precursor (e.g., dichlorosilane) is flown concurrently into the processing chamber with a carrier gas (e.g., $H_2$ and/or $N_2$) and a germanium source (e.g., $GeH_4$). The flow rate of the silicon precursor may be in the range from about 5 sccm to about 1,000 sccm. The flow rate of the silicon precursor may be in the range from about 100 sccm to about 500 sccm. The flow rate of the carrier gas may be in the range from about 1,000 sccm to about 60,000 sccm. The flow rate of the carrier gas may be in the range from about 10,000 sccm to about 20,000 sccm. The flow rate of the germanium source may be in the range from about 10 sccm to about 200 sccm. The flow rate of the germanium source may be in the range from about 50 sccm to about 100 sccm. The processing chamber may be maintained with a pressure from about 0.1 Torr to about 200 Torr (e.g., from about 10 Torr to about 50 Torr; about 20 Torr). The substrate may be kept at a temperature in the range from about 400 degrees Celsius to about 1,000 degrees Celsius (e.g., from about 500 degrees Celsius to about 600 degrees Celsius). The reagent mixture is thermally driven to react and epitaxially deposit a silicon compound, namely a silicon germanium film on the substrate. The process is conducted to form the SiGe layer with a thickness in a range from about 100 Å to about 3,000 Å. The deposition rate may be between about 50 Å/min and about 600 Å/min (e.g., between about 100 Å/min and about 300 Å/min; about 150 Å/min). The germanium concentration is in the range from about 1 atomic percent to about 75 atomic percent of the SiGe compound (e.g., from about 50 atomic percent to about 70 atomic percent, about 65 atomic percent).

The silicon source is usually provided into the processing chamber at a rate within a range from about 40 sccm to about 1,000 sccm (e.g., from about 200 sccm to about 800 sccm; from about 500 sccm to about 600 sccm). Silicon sources that may be used for deposition of the strain relaxed buffer layer include silanes, halogenated silanes, organosilanes or derivatives thereof. Silanes include silane ($SiH_4$) and higher silanes with the empirical formula $Si_aH_{(2a+2)}$, such as disilane ($Si_2H_6$), trisilane ($Si_3H_8$) and tetrasilane ($Si_4H_{10}$), as well as others. Halogenated silanes include compounds with the empirical formula $X'_bSi_aH_{(2a+2-b)}$, where X' is independently selected from F, Cl, Br or I, such as hexachlorodisilane ($Si_2Cl_6$), tetrachlorosilane ($SiCl_4$), trichlorosilane ($Cl_3SiH$), dichlorosilane ($Cl_2SiH_2$) and chlorosilane (Cl-$SiH_3$). Organosilanes include compounds with the empirical formula $R_bSi_aH_{(2a+2-b)}$, where R is independently selected from methyl, ethyl, propyl or butyl, such as methylsilane (($CH_3)SiH_3$), dimethylsilane (($CH_3)_2SiH_2$), ethylsilane (($CH_3CH_2)SiH_3$), methyldisilane (($CH_3)Si_2H_5$), dimethyldisilane (($CH_3)_2Si_2H_4$) and hexamethyldisilane (($CH_3)_6Si_2$). In some implementations, the silicon sources include silane, dichlorosilane and disilane.

The germanium source gas may be provided at a rate of about 50 sccm to about 500 sccm (e.g., about 80 sccm to about 200 sccm; about 90 sccm to about 150 sccm; about 100 sccm). Germanium source gases may include one or more of germane ($GeH_4$), higher germanes, or chlorinated germanium derivatives, such as germanium dichloride ($GeCl_2$), germanium tetrachloride ($GeCl_4$), or dichlorogermane ($Cl_2GeH_2$). Higher germanes include compounds with the empirical formula $Ge_xH_{(2x+2)}$, such as digermane ($Ge_2H_6$), trigermane ($Ge_3H_8$) and tetragermane ($Ge_4H_{10}$), as well as others.

The carrier gas is usually provided into the processing chamber at a flow rate within a range from about 1 slm to about 100 slm (e.g., from about 5 slm to about 80 slm; from about 10 slm to about 40 slm; about 20 slm). Carrier gases may include nitrogen ($N_2$), hydrogen ($H_2$), argon, helium or combinations thereof. In one implementation, an inert carrier gas is used and includes nitrogen, argon, helium or combinations thereof. A carrier gas may be selected based on the precursor(s) used and/or the process temperature of the deposition process.

After deposition of the buffer layer, the chamber in which deposition took place may be purged to remove un-reacted precursor gases and contaminants. In some implementations, the processing chamber may be purged by stopping the flow of the silicon and germanium precursors while continuing to flow the carrier gas. The processing chamber may be actively purged by flowing a purge gas in the substrate-processing chamber. Alternatively, or in addition to introducing the purge gas, the processing chamber may be depressurized in order to remove any residual precursor gases as well as any by-products from the processing chamber. The substrate-processing chamber may be purged by evacuating the substrate-processing chamber. The time period of the purge process should generally be long enough to remove any remaining precursor gases from the substrate-processing chamber.

At block 340, a silicon containing capping layer is formed over the buffer layer 220. The silicon containing capping layer may be silicon containing capping layer 230 as depicted in FIG. 2. The silicon containing capping layer should be thick enough to maintain the morphology of the underlying buffer layer during the subsequent annealing process. In some implementations, the silicon containing capping layer may have a thickness from about 10 Å to about 200 Å. In some implementations, the silicon containing capping layer may have a thickness from about 20 Å to about 80 Å.

The silicon containing capping layer may be epitaxially grown. The silicon source gas and carrier gas may be any of the aforementioned silicon source gases and carrier gases. In some implementations, during deposition of the silicon containing capping layer, a silicon precursor (e.g., disilane) is flown concurrently into the processing chamber with a carrier gas (e.g., $H_2$ and/or $N_2$). In some implementations, the flow rate of the silicon precursor (e.g., disilane) is in the range from about 5 sccm to about 500 sccm (e.g., from about 50 sccm to 250 sccm; from about 100 sccm to 200 sccm). The flow rate of the carrier gas is from about 1,000 sccm to about 60,000 sccm (e.g., from about 10,000 sccm to 40,000 sccm; from about 20,000 sccm to 40,000 sccm). The processing chamber is maintained with a pressure from about 0.1 Torr to about 200 Torr (e.g., from about 10 Torr to about 50 Torr; about 20 Torr). The substrate may be maintained at a temperature in the range from about 400 degrees Celsius to about 1,000 degrees Celsius (e.g., from about 500 degrees Celsius to about 600 degrees Celsius).

At block 350 if the buffer layer/silicon containing capping layer has achieved a desired thickness, the method 300 proceeds to block 360 where the buffer layer/silicon containing capping layer is exposed to an annealing process. If the buffer layer has not achieved the desired thickness, the method 300 proceeds back to block 330 and block 340 where additional buffer layer/silicon containing capping layers may be deposited on the previously deposited buffer layer/silicon containing capping layer material.

At block 360, the buffer layer is exposed to an annealing process. The conditions of the annealing process are typically selected such that the buffer layer is heated to a temperature below the buffer layer's melting point but high enough to allow diffusion of dopants (when present) and rearrangement of lattice atoms to relax the buffer layer 220. Exemplary annealing processes include soak anneals, spike anneals, nanosecond anneals, millisecond anneals, laser annealing and combinations thereof. In some implementations, the buffer layer 220 is annealed without significantly increasing the temperature of the underlying substrate 210 thus allowing for rapid cooling of the buffer layer. Exemplary thermal processing systems in which the rapid heating process may be performed include the RADIANCE® RTP system, RadiancePlus™ RTP system, ASTRA® DSA (dynamic surface anneal) and VULCAN™ RTP system all available from Applied Materials, Inc., Santa Clara, Calif.

The annealing process may be performed in the same chamber as the deposition processes of at least one of block 330 and block 340. For example, the annealing process and the deposition processes may be performed in the epitaxial processing chamber 100 depicted in FIG. 1. The annealing process may be performed in a chamber separate from the processing chamber used for the process of block 330. In implementations where the annealing process is performed in a separate chamber, the separate chamber may be integrated on the same platform as the deposition chamber. In some implementations where the annealing process is performed in a separate chamber, the separate chamber may be positioned ex-situ from the integrated platform on which the deposition chamber is positioned.

The annealing process may be any high temperature thermal annealing process that is sufficient to cause the buffer layer to relax. The temperature sufficient to cause the buffer layer to relax may be dependent upon factors including but not limited to the buffer materials and substrate materials used, the relative strain with respect to the substrate material, the type of anneal process used, the duration of the process, the temperature ramp-up rates and the temperature ramp-down rates. In some implementations, the annealing temperature is from about 200 degrees Celsius to about 2,000 degrees Celsius (e.g., from about 650 degrees Celsius to about 850 degrees Celsius; about 850 degrees Celsius or above). In some implementations where the material of the buffer layer 220 has a low dissociation temperature, the desired annealing temperature should be reached very fast and the duration of anneal should be limited to a relatively short time, such as on the order of about one second or less, or at sub microsecond duration, to preserve the surface morphology and the lattice quality of the buffer layer 220. Therefore, it may be advantageous to use a rapid thermal annealing process or a pulsed laser annealing process to melt and recrystallize the buffer layer 220.

The anneal process may be performed in a hydrogen gas containing environment. The hydrogen gas may be flown into the chamber a flow rate in a range from about 10,000 sccm to about 30,000 sccm (e.g., from about 15,000 sccm to about 25,000 sccm).

While not discussed in detail here, at block 370, one or more device layers and/or active material layers 240 may be formed over the buffer layer 220 and silicon containing capping layer 230. The active material layer 240 may include for example, a p-n junction, which is necessary for the fabrication of the desired semiconductor device, such as light emitting diodes (LEDs), laser diodes (LDs), or other electronic applications such as transistors. It is contemplated that the process of the present disclosure is suitable for use with more sophisticated structures. Such structures may include those that use one or more quantum wells as active layers or superlattice structures as part of the crystal transition between the substrate and the device layers, for example. In some implementations, the device layer is a germanium layer.

Figure 4:
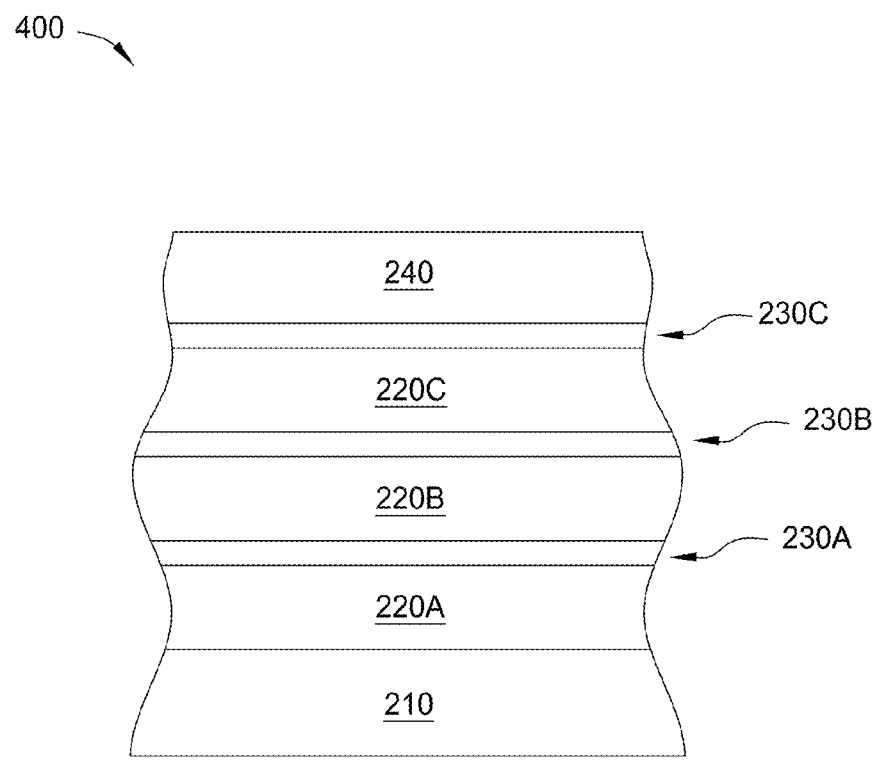
FIG. 4 is a schematic structure of a device formed according to another implementation described herein.

FIG. 4 is a schematic structure of a device formed according to another implementation described herein. The device 400 depicted in FIG. 4 is similar to the device 200 depicted in FIG. 2 except that the device 400 has multiple buffer layers 220A, 220B and 220C each with a corresponding silicon containing capping layer 230A, 230B and 230C respectively. It should be understood that although three buffer layer/silicon containing capping layers are depicted in FIG. 4, any plurality of buffer layer/silicon capping layers may be used. The buffer layers 220A-220C and corresponding silicon containing capping layers 230A-230C may be deposited using the techniques described above in blocks 330, 340 and 350. After deposition of the plurality of buffer layers/silicon capping layers, the buffer layers/silicon capping layers are exposed to an annealing process as described in block 360.

EXAMPLES

The following non-limiting examples are provided to further illustrate implementations described herein. However, the examples are not intended to be all inclusive and are not intended to limit the scope of the implementations described herein.

Example #1 (Comparative Example)

A substrate, Si<100>, (e.g., 300 mm OD) was employed. The wafer was prepared by subjecting to a 1% HF dip for 120 seconds. The wafer was loaded into the deposition chamber (EPI CENTURA® chamber) and baked in a hydrogen atmosphere at 800° C. for 60 seconds to remove native oxides. A flow of carrier gas, hydrogen (20,000 sccm), was directed towards the substrate and the source compounds were added to the carrier flow. Dichlorosilane (500 sccm) and germane (100 sccm) were added to the chamber at 20 Torr and 530° C. The substrate was maintained at 530° C. Deposition was carried out for about 6 minutes to form a 1,000 Å SiGe film with a germanium concentration of 65 atomic percent. The flows of germane and dichlorosilane were stopped while the flow of carrier gas was maintained to remove unreacted silane and germane from the deposition chamber.

The flow of hydrogen was increased to 30,000 sccm for the annealing process. The SiGe buffer layer was annealed in the hydrogen containing environment at a temperature of 850° C. for a period of about 60 seconds.

Figure 5A:
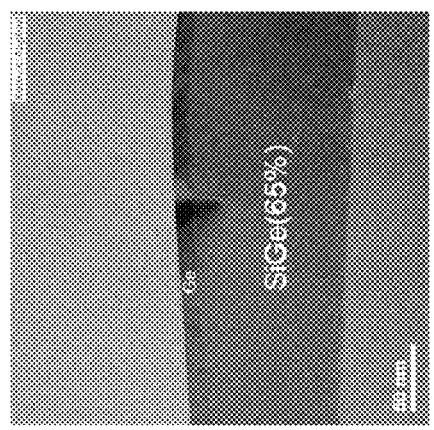
FIG. 5A depicts an SEM photograph of a device stack formed according to prior art methods.

The flow of carrier gas was maintained and the temperature in the deposition chamber was decreased to 420° C. and germane was added to the chamber at 100 sccm. Deposition was carried out for about 30 seconds to form a 150 Å Ge film on the SiGe buffer layer. The resulting structure is depicted in FIG. 5A.

Example #2

A substrate, Si<100>, (e.g., 300 mm OD) was employed. The wafer was prepared by subjecting to a 1% HF dip for 120 seconds. The wafer was loaded into the deposition chamber (EPI CENTURA® chamber) and baked in a hydrogen atmosphere at 800° C. for 60 seconds to remove native oxides. A flow of carrier gas, hydrogen (20,000 sccm), was directed towards the substrate and the source compounds were added to the carrier flow. Dichlorosilane (500 sccm) and germane (100 sccm) were added to the chamber at 20 Torr and 530° C. The substrate was maintained at 530° C. Deposition was carried out for about 8 minutes to form a 1,000 Å SiGe film with a germanium concentration of 65 atomic percent. The flows of germane and dichlorosilane were stopped while the flow of carrier gas was maintained to remove unreacted dichlorosilane and germane from the deposition chamber.

The flow of hydrogen gas was increased to 25,000 sccm. Disilane was added to the chamber at 20 Torr and 530° C. The substrate was maintained at 530° C. Deposition was carried out for 30 seconds to form a 25 Å Si capping layer on the SiGe buffer layer. After deposition of the silicon capping layer, the flow of hydrogen gas was increased to 30,000 sccm and the SiGe buffer layer and the Si capping layer were annealed in the hydrogen containing environment at a temperature of 850° C. for a period of about 60 seconds.

Figure 5B:
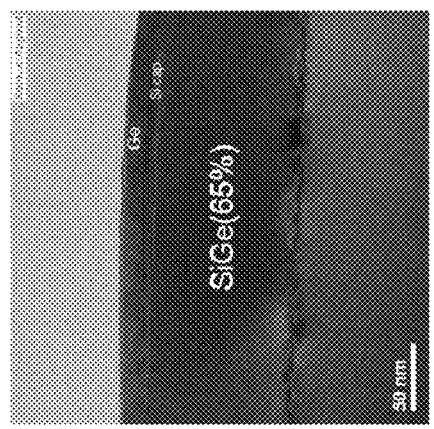
FIGS. 5B-5C depict SEM photographs of device stacks deposited according to implementations described herein.

After annealing, the flow of hydrogen was maintained and the temperature in the deposition chamber was increased to 850° C. and germane was added to the chamber at 100 sccm. Deposition was carried out for about 30 seconds to form a 150 Å Ge film on the silicon capping layer. The resulting structure is depicted in FIG. 5B.

Example #3

A substrate, Si<100>, (e.g., 300 mm OD) was employed. The wafer was prepared by subjecting to a 1% HF dip for 120 seconds. The wafer was loaded into the deposition chamber (EPI CENTURA® chamber) and baked in a hydrogen atmosphere at 800° C. for 60 seconds to remove native oxides. A flow of carrier gas, hydrogen (20,000 sccm), was directed towards the substrate and the source compounds were added to the carrier flow. Dichlorosilane (500 sccm) and germane (100 sccm) were added to the chamber at 20 Torr and 530° C. The substrate was maintained at 530° C. Deposition was carried out for about one minute to form a 140 Å SiGe film with a germanium concentration of 65 atomic percent. The flows of germane and dichlorosilane were stopped while the flow of carrier gas was maintained to remove unreacted dichlorosilane and germane from the deposition chamber.

The flow of hydrogen gas was increased to 25,000 sccm. Disilane was added to the chamber at 20 Torr and 530° C. The substrate was maintained at 530° C. Deposition was carried out for 30 seconds to form a 25 Å Si capping layer on the SiGe buffer layer. After deposition of the Si capping layer, the process of depositing the SiGe buffer layer and the Si capping layer were repeated seven more times to form the multi-layer buffer structure. After deposition of the multi-layer buffer structure, the flow of hydrogen gas was increased to 30,000 sccm and the multi-layer buffer structure was annealed in the hydrogen containing environment at a temperature of 850° C. for a period of about 60 seconds.

After annealing, the flow of hydrogen was maintained and the temperature in the deposition chamber was increased to 850° C. and germane was added to the chamber at 100 sccm. Deposition was carried out for about 30 seconds to form a 150 Å Ge film on the silicon capping layer. The resulting structure is depicted in FIG. 5C.

Figure 5C:
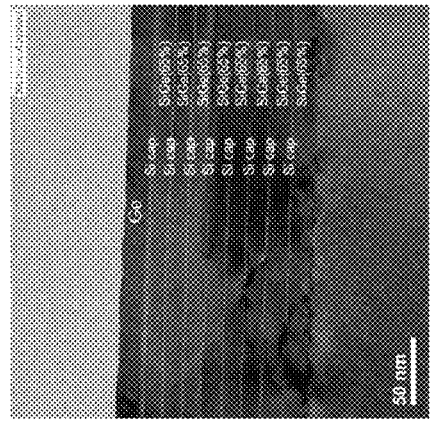

FIGS. 5A-5C depict SEM photographs of device stacks deposited according to implementations described herein. FIG. 5A depicts a germanium layer grown directly on an annealed SiGe (65%) buffer layer using a prior art process. Both roughness and curvature are visible on both the SiGe buffer layer and the germanium layer. FIG. 5B depicts a germanium layer grown on an annealed [SiGe(65%)+Si cap] according to implementations described herein. The addition of the a thin silicon cap layer on SiGe (65%) tends to keep the morphology smooth due to the higher melting point of silicon compared to germanium. As depicted in FIG. 5B, the surface roughness is reduce in comparison to the prior art process of FIG. 5A but is still visible. FIG. 5C depicts germanium grown on [SiGe(65%)+Si cap]×8 superlattice. The addition of additional thin silicon capping layers in SiGe(65%) and the formation of a superlattice lowers the surface roughness further down. As shown in FIG. 5O, all of the silicon cap layers maintain their flat geometry after anneal. The silicon cap layers depicted in FIG. 5O are therefore more tensilely strained by the neighboring SiGe (65%) layers. The germanium grown on top is compressively strained against the topmost silicon capping layer.

Figure 6:
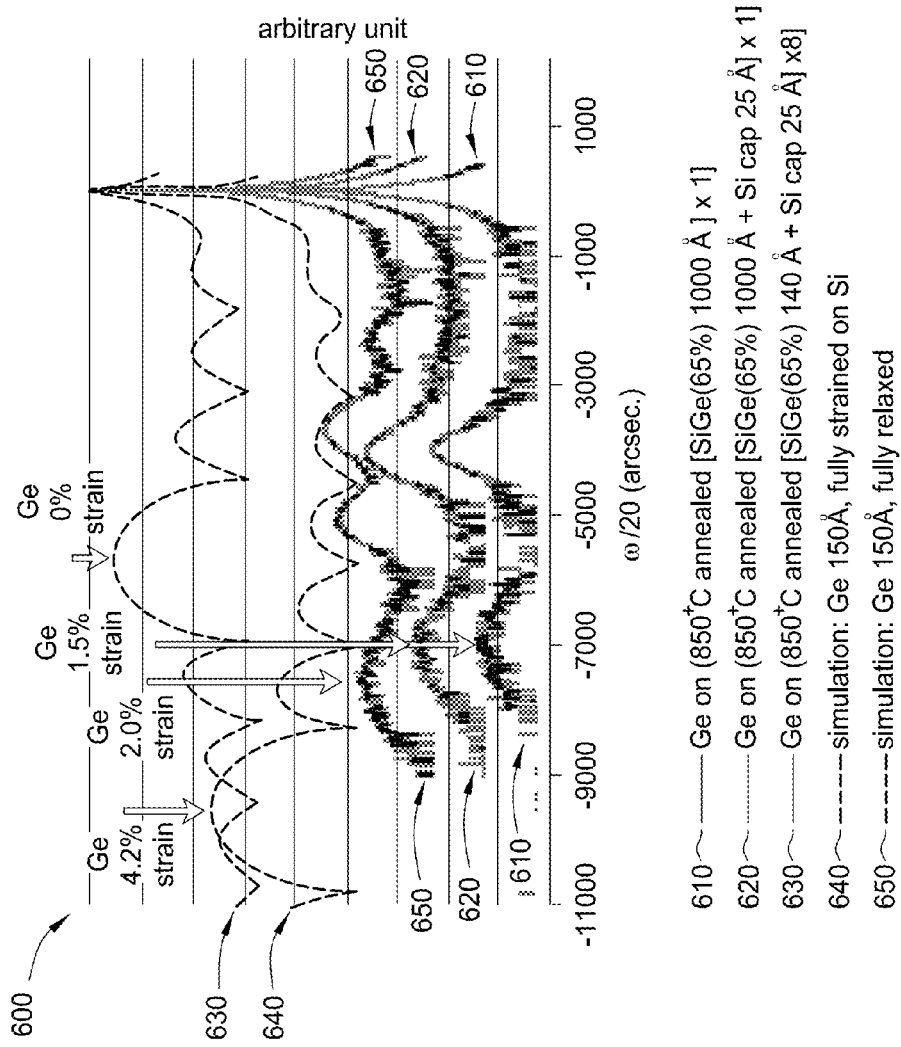
FIG. 6 is a plot depicting X-ray diffraction (XRD) of various films.

FIG. 6 is a plot 600 depicting X-ray diffraction (XRD) data of the various films depicted in FIGS. 5A-5C. The x-axis represents the omega-2theta angle, which is the angle made by the incident X-ray and the diffracted X-ray beams. The y-axis represents the intensity of the diffracted X-ray. The data can be fit by modeling as shown by line 640 and line 650 in FIG. 6. The specific shape of each line demonstrates the compressive strain level. The farther apart the Si peak (the highest, at 0 degree) and the main Ge peak (the one between −7000 and −9000 degrees) are, the more compressively strained the final Ge layer is. Line 610 represents the compressive strain of the final Ge layer in FIG. 5A. Line 620 represents the compressive strain of the final Ge layer in FIG. 5B. Line 630 represents the compressive strain of the final Ge layer in FIG. 5C.

Figure 7:
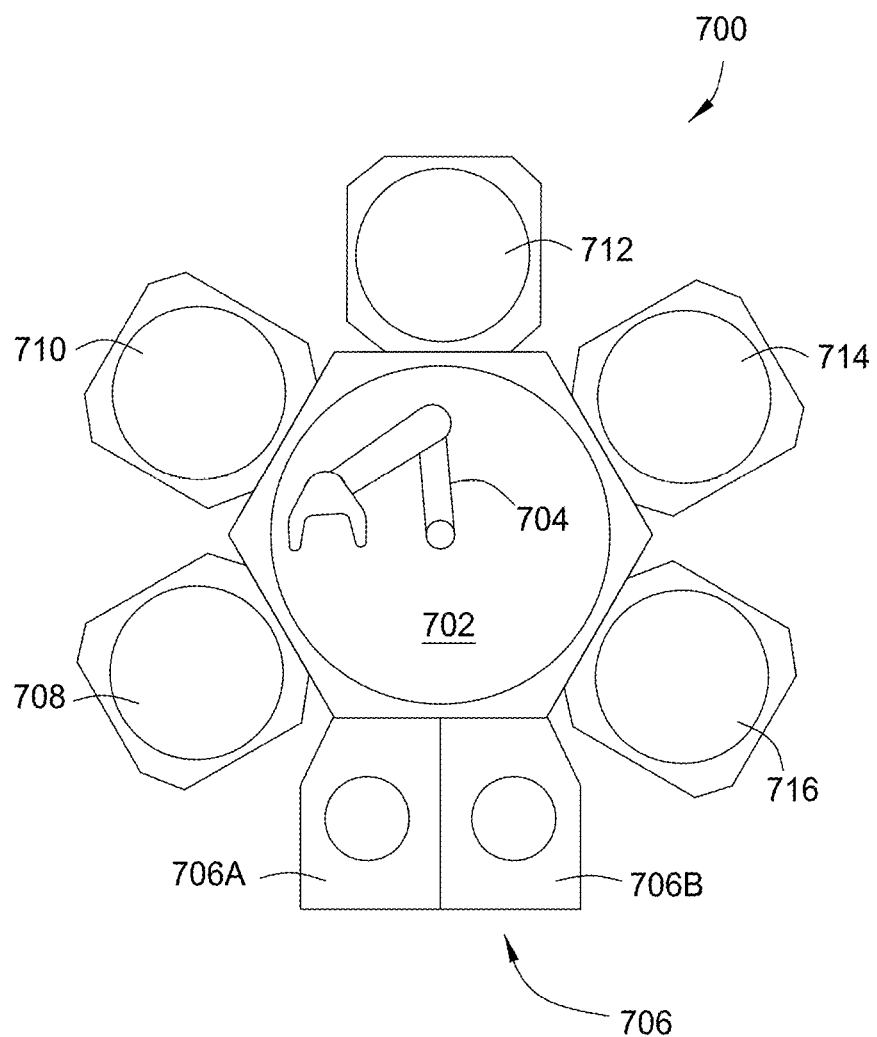
FIG. 7 is a plan view of a cluster tool according to another implementation described herein.

FIG. 7 is a plan view of a cluster tool according to another implementation described herein. The cluster tool 700 features at least one epitaxial deposition chamber, as described above. An example of the cluster tool 700 is the CENTURA® system available from Applied Materials, Inc., of Santa Clara, Calif. Cluster tools manufactured by others may be used as well. A transfer robot 704 of any convenient type is disposed in a transfer chamber 702 of the cluster tool. A load-lock 706, with two load-lock chambers 706A, 706B is coupled to the transfer chamber 702. A plurality of processing chambers 708, 710, 712, 714, and 716 are also coupled to the transfer chamber 702. The plurality of processing chamber 708, 710, 712, 714, and 716 may include at least one of: a preclean chamber, a material deposition chamber such as an epitaxial deposition chamber, and a thermal processing chamber, such as an anneal, degas, or oxidation chamber.

Processing chamber 708 may be a preclean chamber configured to clean the substrate prior to deposition of a buffer layer and/or device layer. The preclean chamber may be configured to perform the Applied Materials SICONI™ Preclean process. Processing chamber 710 and/or processing chamber 714 may be a material deposition chamber such as an epitaxial deposition chamber capable of performing an epitaxial growth process. Processing chamber 712 and/or 716 may be a thermal treatment chamber capable of performing a thermal treatment process.

The cluster tool 700 may be used to perform the method 300 described above. During processing, a substrate that is to be processed may arrive to the cluster tool 700 in a pod (not shown). The substrate is transferred from the pod to the vacuum compatible load lock 706A, 706B by the factory interface robot (not shown). The substrate is then picked by the transfer robot 704 in the transfer chamber 702, which is generally kept in a vacuum state. The transfer robot 704 then loads the substrate into the processing chamber 708 for cleaning as described in block 320. The transfer robot 704 then picks up the substrate from the processing chamber 708 and loads the substrate into the processing chamber 710 or 714, whichever is available, for material deposition. An epitaxial buffer layer may be grown on the cleaned substrate in the processing chamber 710 or 714. An epitaxially deposited silicon containing layer may be grown on the buffer layer in the same processing chamber 710 or 714 as the epitaxial buffer layer is grown. In some implementations, the epitaxially deposited silicon containing layer may be grown in a different processing chamber than the processing chamber that the buffer layer is grown in (e.g., processing chamber 710 or 714). The transfer robot 704 then picks up the substrate from the processing chamber 710 or 714 and transfers the substrate into the processing chamber 712 or 716, whichever is available, for thermal processing. The epitaxial buffer layer is then exposed to an annealing process as described in block 360. The transfer robot 704 then picks the substrate from the processing chamber 712 or 716 and transfers the substrate to processing chamber 714 for deposition of active material over the buffer layer as described in block 370.

While the foregoing is directed to implementations of the present disclosure, other and further implementations of the disclosure may be devised without departing from the basic scope thereof, and the scope thereof is determined by the claims that follow.

The invention claimed is:

1. A method of heteroepitaxial deposition of a strain relaxed buffer (SRB) layer on a substrate, comprising:
exposing a substrate to an etchant species, wherein the etchant species is generated from a fluorine containing precursor and a hydrogen containing precursor in a remote plasma source;
epitaxially depositing a silicon-germanium buffer layer on the substrate, comprising flowing a silicon precursor gas, a germanium source gas, and a hydrogen pas to deposit the silicon-germanium buffer layer;
epitaxially depositing a silicon containing capping layer on the silicon-germanium buffer layer, comprising:
stopping the flow of the germanium source gas while continuing to flow the silicon precursor gas and the hydrogen gas to deposit the silicon containing capping layer on the silicon-germanium buffer layer; and
annealing the silicon-germanium buffer layer and the silicon containing capping layer to relax the silicon-germanium buffer layer, wherein annealing the silicon-germanium buffer layer comprises:
stopping the flow of the silicon precursor gas while continuing to flow the hydrogen gas; and
exposing the substrate to an annealing temperature from about 200 degrees Celsius to about 850 degrees Celsius in the presence of the hydrogen gas.

2. The method of claim 1, further comprising:
epitaxially depositing a second buffer layer on the silicon containing capping layer; and
epitaxially depositing a second silicon containing capping layer on the second buffer layer, wherein epitaxially depositing a second buffer layer and epitaxially depositing a second silicon containing capping layer occur prior to annealing the silicon-germanium buffer layer and the silicon containing capping layer.

3. The method of claim 1, further comprising repeating the epitaxially depositing a silicon-germanium buffer layer on a substrate and the epitaxially depositing a silicon containing capping layer on the silicon-germanium buffer layer until a desired thickness is achieved.

4. The method of claim 1, further comprising depositing active material on the silicon containing capping layer.

5. The method of claim 1, wherein the substrate is a material selected from the group consisting of: sapphire ($Al_2O_3$), doped silicon (Si), undoped silicon, silicon carbide (SiC), spinel, zinc oxide, gallium-arsenide (GaAs), lithium gallate, indium phosphide (InP), single-crystal GaN, aluminum nitride (AlN), $GdScO_3$ (GSO), $MoSe_2$, $Ge_2Sb_2Te_5$ (GST) and combinations thereof.

6. The method of claim 1, wherein the epitaxially depositing a silicon-germanium buffer layer and annealing the silicon-germanium buffer layer and the silicon containing capping layer to relax the silicon-germanium buffer layer occur in the same processing chamber.

7. A method of heteroepitaxial deposition of a strain relaxed buffer (SRB) layer on a substrate, comprising:
exposing a silicon substrate to an etchant species, wherein the etchant species is generated from a fluorine containing precursor and a hydrogen containing precursor in a remote plasma source;
epitaxially depositing a silicon-germanium ($Si_{1-x}Ge_x$) buffer layer on the silicon substrate, comprising flowing a silicon precursor gas, a germanium source gas, and a hydrogen carrier gas to deposit the silicon-germanium buffer layer, wherein 0<x<1;
epitaxially depositing a silicon containing capping layer on the silicon-germanium buffer layer, comprising:
stopping the flow of the germanium source gas while continuing to flow the silicon precursor gas and the hydrogen carrier gas to deposit the silicon containing capping layer on the silicon-germanium buffer layer;
annealing the silicon-germanium buffer layer and the silicon containing capping layer to relax the silicon-germanium buffer layer, wherein annealing the silicon-germanium buffer layer comprises:
stopping the flow of the silicon precursor gas while continuing to flow the hydrogen carrier gas; and
exposing the substrate to an annealing temperature from about 200 degrees Celsius to about 850 degrees Celsius in the presence of the hydrogen carrier gas; and
depositing a germanium layer on the silicon containing capping layer.

8. The method of claim 7, further comprising:
epitaxially depositing a second silicon-germanium buffer layer on the silicon containing capping layer; and
epitaxially depositing a second silicon containing capping layer on the second silicon-germanium buffer layer, wherein the epitaxially depositing a second silicon-germanium buffer layer and the epitaxially depositing a second silicon containing capping layer occur prior to annealing the silicon-germanium buffer layer and the silicon containing capping layer.

9. The method of claim 7, further comprising repeating the epitaxially depositing a silicon-germanium buffer layer on the silicon substrate and the epitaxially depositing a silicon containing capping layer on the silicon-germanium buffer layer until a desired thickness is achieved.

10. The method of claim 7, wherein the epitaxially depositing a silicon-germanium buffer layer and the annealing the silicon-germanium buffer layer and the silicon containing capping layer to relax the silicon-germanium buffer layer occur in the same processing chamber.

11. A method of forming a heteroepitaxial film on a substrate in an integrated processing system, comprising:
exposing a substrate to an etchant species in a pre-clean chamber of an integrated processing system, wherein the etchant species is generated from a fluorine containing precursor and a hydrogen containing precursor in a remote plasma source;
transferring the substrate to a first processing chamber of the integrated processing system;
epitaxially depositing a silicon-germanium buffer layer over the substrate in the first processing chamber of the integrated processing system, comprising flowing a silicon precursor gas, a germanium source gas, and a hydrogen carrier gas to deposit the silicon-germanium buffer layer;
epitaxially depositing a silicon containing capping layer over the silicon-germanium buffer layer in the first processing chamber of the integrated processing system, comprising:
stopping the flow of the germanium source gas while continuing to flow the silicon precursor gas and the hydrogen carrier gas to deposit the silicon containing capping layer on the silicon-germanium buffer layer; and
annealing the silicon-germanium buffer layer and the silicon containing capping layer in the first processing chamber, wherein annealing the silicon-germanium buffer layer comprises:
stopping the flow of the silicon precursor gas while continuing to flow the hydrogen carrier gas; and
exposing the substrate to an annealing temperature from about 200 degrees Celsius to about 850 degrees Celsius in the presence of the hydrogen carrier pas.

12. The method of claim 11, further comprising:
removing the substrate from the first processing chamber;
transferring the substrate to a second processing chamber of the integrated processing system; and
depositing an active material layer over the silicon-germanium buffer layer.

* * * * *